(12) United States Patent
Aoki

(10) Patent No.: US 6,639,299 B2
(45) Date of Patent: Oct. 28, 2003

(54) SEMICONDUCTOR DEVICE HAVING A CHIP SIZE PACKAGE INCLUDING A PASSIVE ELEMENT

(75) Inventor: Yutaka Aoki, Ome (JP)

(73) Assignees: Casio Computer Co., Ltd., Tokyo (JP); Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/118,403

(22) Filed: Apr. 8, 2002

(65) Prior Publication Data

US 2002/0149086 A1 Oct. 17, 2002

(30) Foreign Application Priority Data

Apr. 17, 2001 (JP) .......................................... 2001-118242

(51) Int. Cl.$^7$ ............................................... H01L 29/00
(52) U.S. Cl. ....................... 257/531; 257/528; 257/532; 438/329; 438/957
(58) Field of Search ................................ 257/528, 531, 257/532; 438/329, 957

(56) References Cited

U.S. PATENT DOCUMENTS 4,617,193 A    10/1986  Wu
5,481,131 A *  1/1996  Staudinger et al. .......... 257/531
5,874,770 A *  2/1999  Saia et al. .................... 257/536
6,362,525 B1 * 3/2002  Rahim ........................... 257/738

FOREIGN PATENT DOCUMENTS

JP         2000-235979 A      8/2000

* cited by examiner

Primary Examiner—Nathan J. Flynn
Assistant Examiner—Scott R Wilson
(74) Attorney, Agent, or Firm—Frishauf, Holtz, Goodman & Chick, P.C.

(57) ABSTRACT

A semiconductor device includes a semiconductor substrate on which a circuit element forming region and a plurality of connection pads are formed, a first columnar electrode which is formed on a first connection pad so as to be electrically connected to the first connection pad, a first conductive layer which is formed on a second connection pad so as to be electrically connected to the second connection pad, an encapsulating film which is formed at least around the first columnar electrode, on the semiconductor substrate and on the first conductive layer, and a second conductive layer which is formed on the encapsulating film so as to face the first conductive layer. A passive element is formed from the first and second conductive layers.

11 Claims, 15 Drawing Sheets

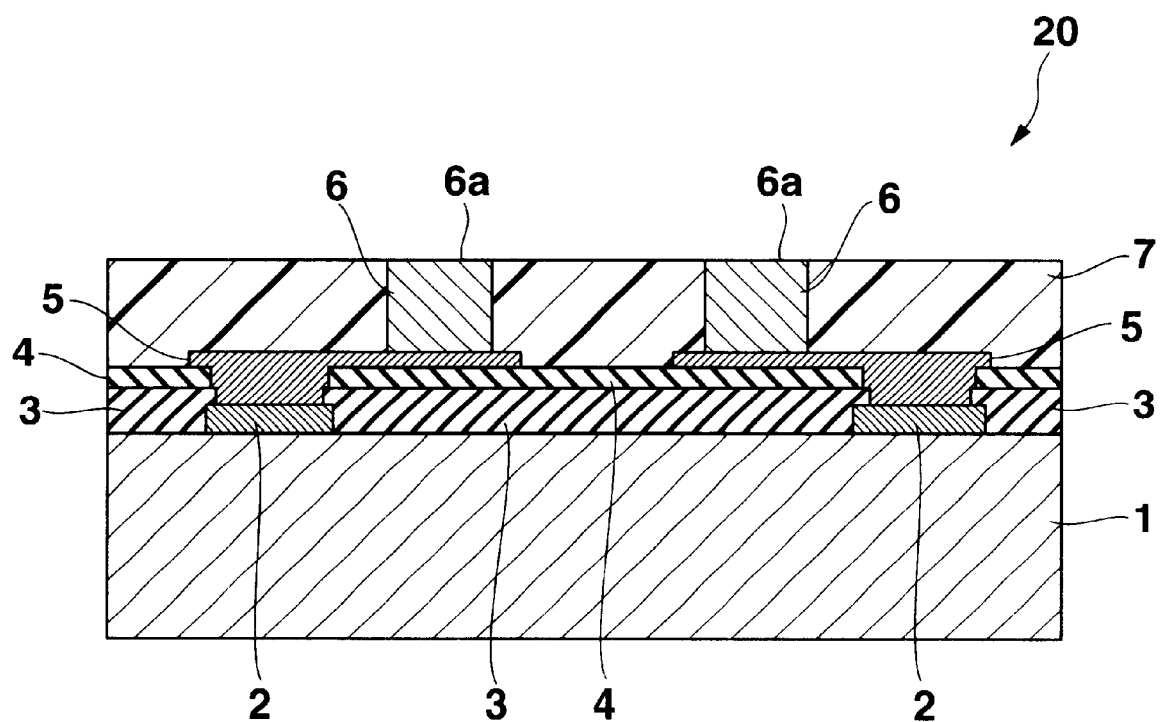

SEMICONDUCTOR DEVICE HAVING A CHIP SIZE PACKAGE INCLUDING A PASSIVE ELEMENT

CROSS-REFERENCE TO RELATED APPLICATIONS

This application is based upon and claims the benefit of priority from the prior Japanese Patent Application No. 2001-118242, filed Apr. 17, 2001, the entire contents of which are incorporated herein by reference.

BACKGROUND OF THE INVENTION

1. Field of the Invention

The present invention relates to a semiconductor device having a CSP (Chip Size Package) structure, a manufacturing method therefor, and an electronic device having the semiconductor device.

2. Description of the Related Art

Semiconductor devices having a CSP structure in which chip and package sizes are almost equal to each other are recently known and used to increase a mounting density on a circuit board. An example of this structure is shown in FIG. 16. FIG. 16 is a sectional view showing a semiconductor device 20. The semiconductor device 20 has a so-called wafer level CSP structure obtained by dicing, into chips, a wafer having undergone package processing including a protective film formation step, a conductive layer formation step, a post formation step, and a resin encapsulation step.

The semiconductor devices 20 are formed from a wafer. The surface (circuit surface side) of a semiconductor substrate 1 bearing a circuit element or elements has a plurality of connection pads 2 made from aluminum electrodes or the like. A passivation film (insulating film) 3 made of silicon oxide, silicon nitride, or the like is formed on a circuit side of the semiconductor substrate 1 including the upper surfaces of the connection pads 2 so as to expose the center of each connection pad 2.

A protective film 4 with openings so as to expose the center of each connection pad 2 is formed on the upper surface of the passivation film 3. The protective film 4 is formed by, e.g., applying a polyimide-based resin to the entire circuit surface side of the wafer 1, curing the resin, performing resist patterning and protective film patterning with an etching solution, and removing the resist.

Conductive layers 5 electrically connected to the connection pads 2 are formed on the protective film 4 formed in the above manner. Posts 6 made from columnar electrodes are formed at predetermined portions on the conductive layer 5. An oxide film on a distal end face 6a of each post 6 which has been naturally formed is removed and subjected to metallization processing such as solder printing. The post 6 is used to connect a terminal on a circuit board (not shown). The height of the post 6 is at least 50 μm, and typically about 100 to 150 μm. The post 6 is formed into a straight shape to absorb a stress generated by the difference in thermal expansion coefficient between the semiconductor substrate 1 and the circuit board.

An encapsulating film 7 made of a resin such as polyimide or epoxy is formed on the entire surface side of the semiconductor substrate 1 between the posts 6.

A filter circuit and antenna element formed from passive elements are required to implement an RF radio circuit module such as a Bluetooth module or GPS receiving module by using the semiconductor device 20 with the above-described wafer level CSP structure. These passive elements cannot be conventionally mounted inside a chip, and are arranged outside the chip as discrete components. This makes it difficult to further micronize the module.

In such an RF circuit module, the wiring length between components influences frequency characteristics, and is difficult to further shorten. The frequency characteristics are, therefore, difficult to improve further.

BRIEF SUMMARY OF THE INVENTION

The present invention has an advantage capable of mounting, on a chip, passive elements such as an antenna element and capacitive element or a passive circuit formed from them and micronizing the module in a semiconductor device which is obtained by cutting a wafer into chips and has a CSP structure in which chip and package sizes are almost equal. The present invention can provide a mounting structure suitable for an electronic device having a semiconductor device in which an antenna element is mounted on a chip.

To achieve the above advantage, a semiconductor device according to the present invention comprises a first columnar electrode which is electrically connected to at least one first connection pad among a plurality of connection pads on a semiconductor substrate on which a circuit element forming region and the plurality of connection pads are formed, at least one first conductive layer which is connected to at least one second connection pad, an encapsulating film which is formed at least around the first columnar electrode and on the first conductive layer on the semiconductor substrate, and at least one second conductive layer which is formed on the encapsulating film so as to face the first conductive layer. The facing first and second conductive layers can form at least one passive element, e.g., a capacitive element. The semiconductor device further comprises a second columnar electrode which is electrically connected to the second connection pad and is connected to the second conductive layer, and a third columnar electrode which is electrically connected to at least one third connection pad and is connected to the second conductive layer. By using the second connection pad as a ground pad and the third connection pad as a feeding pad, an antenna element, e.g., an inverted F-shaped antenna can be formed as a passive element. The semiconductor device further comprises a plurality of passive elements, and a third conductive layer which is connected between the passive elements and has a thin-film passive element. The passive elements and thin-film passive element can form a passive circuit, e.g., a filter circuit.

A passive element or circuit can be formed on the circuit element forming region of the semiconductor substrate and connected to the circuit element of the semiconductor substrate. A module constituted using this semiconductor device can be micronized.

In an electronic device comprising a semiconductor substrate on which an antenna element is formed in the above way, and a wiring board on which the semiconductor device is mounted and a plurality of wiring patterns are formed, no wiring pattern is formed in a region of the wiring board that faces the second conductive layer of the semiconductor device, or the region is an opening. This structure can suppress degradation in antenna performance, obtaining a high radiation efficiency of radio waves.

To achieve the above advantage, according to a semiconductor device manufacturing method of the present invention, an insulating film is formed in each chip formation region of a semiconductor wafer substrate having a plurality of chip formation regions each having a circuit element forming region and a plurality of connection pads. Then, a first columnar electrode is electrically connected to at least one first connection pad in each chip formation region, and a first conductive layer is formed on the insulating film so as to be connected to at least one second connection pad. After an encapsulating film is formed on the insulating film and first conductive layer, at least one second conductive layer facing the first conductive layer is formed on the encapsulating film in the chip formation region. A passive element such as an antenna element or capacitive element, or a passive circuit such as a filter circuit is formed on the circuit element forming region. Thereafter, the semiconductor wafer substrate is diced into the respective chip formation regions.

This method allows simultaneously forming a plurality of semiconductor devices each having a passive element or circuit on a circuit element forming region.

BRIEF DESCRIPTION OF THE SEVERAL VIEWS OF THE DRAWING

FIG. 16 is a sectional view showing a structure of a conventional semiconductor device having a CSP structure.

DETAILED DESCRIPTION OF THE INVENTION

A semiconductor device and manufacturing method therefor according to preferred embodiments will be described in detail below with reference to the several views of the accompanying drawings.

<First Embodiment>

Figure 1:
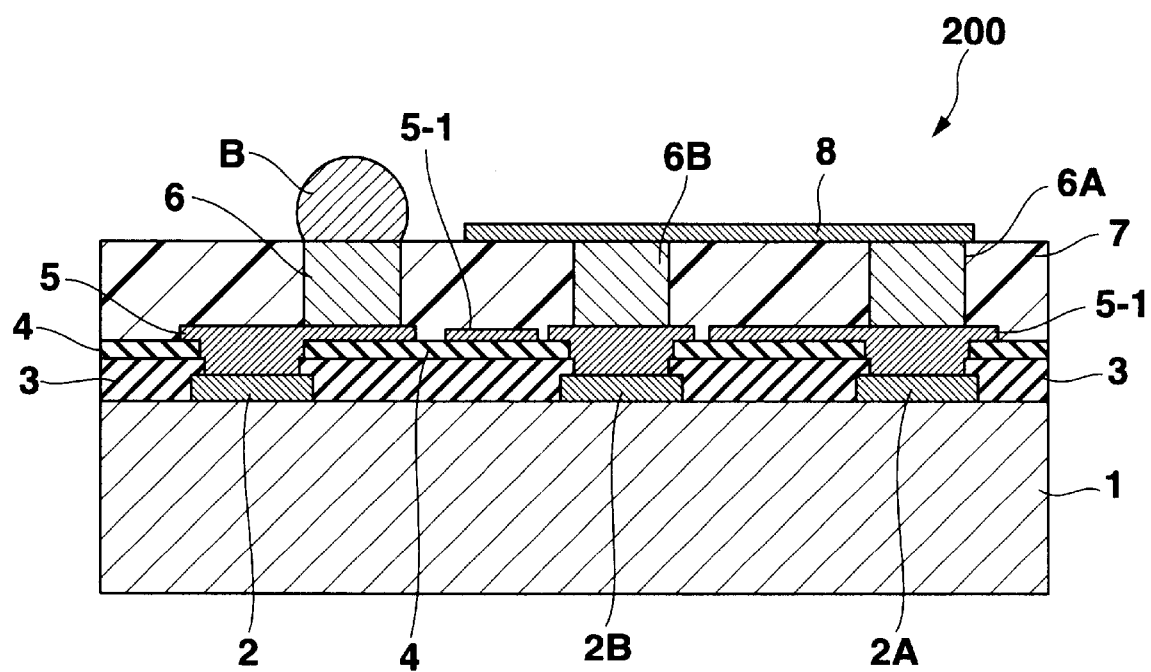
FIG. 1 is a sectional view showing a structure of a semiconductor device according to a first embodiment of the present invention.
Figure 2:
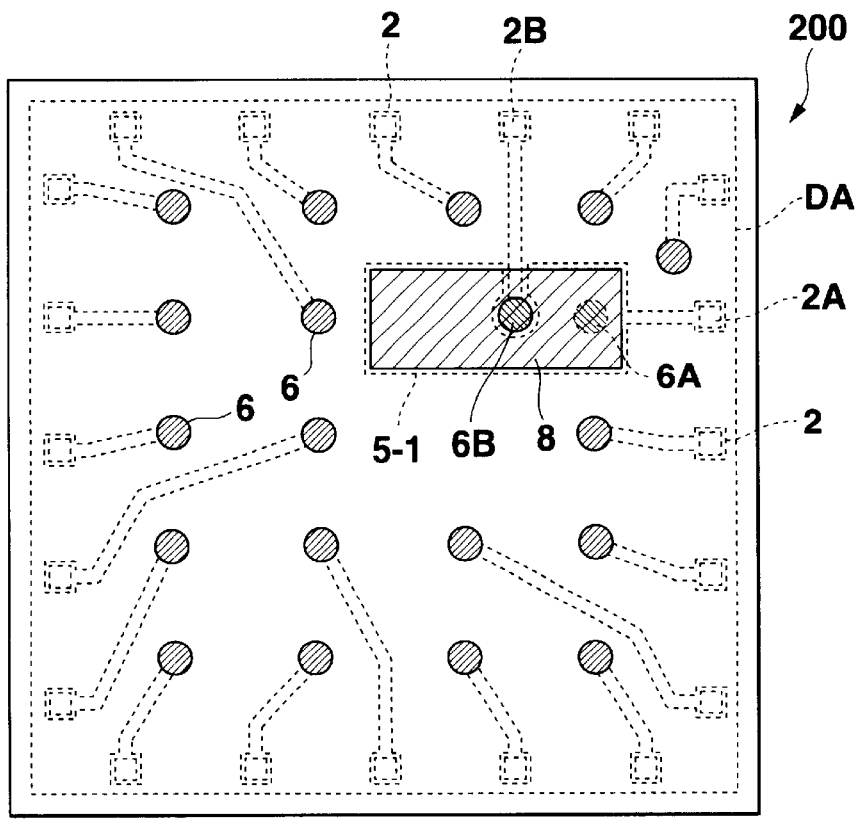
FIG. 2 is a plan view showing a first example of a structure on a surface side of the semiconductor device according to the first embodiment of the present invention.
Figure 3:
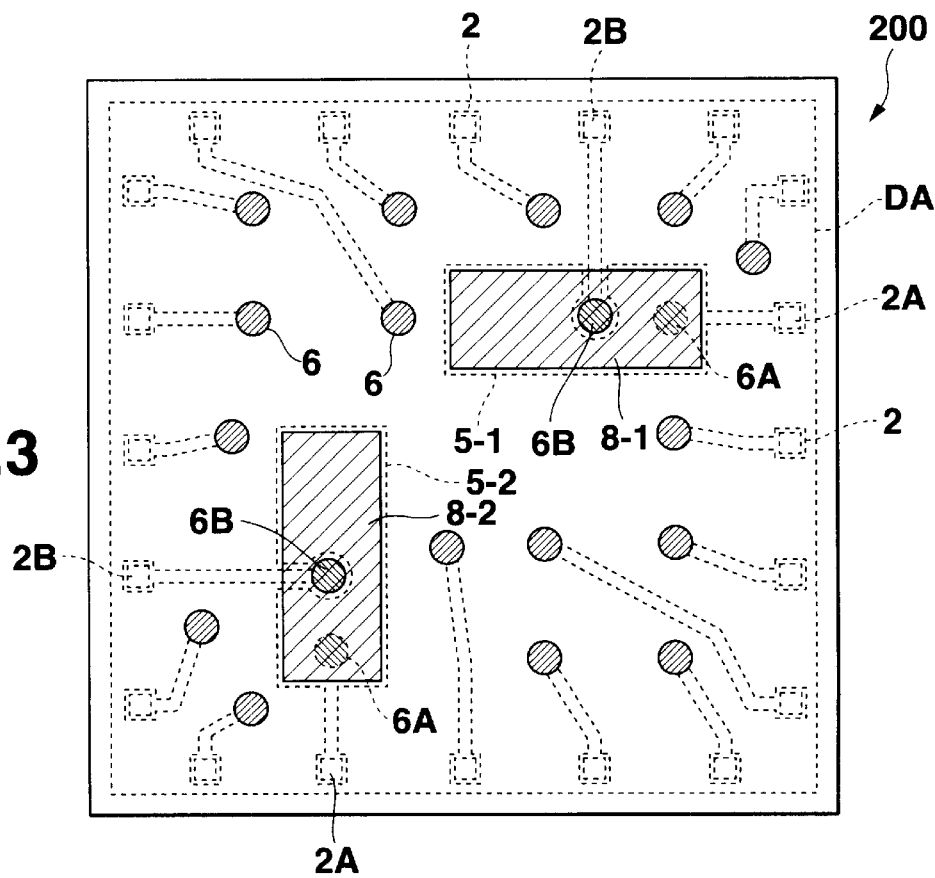
FIG. 3 is a plan view showing a second example of the structure on the surface side of the semiconductor device according to the first embodiment of the present invention.

FIG. 1 is a sectional view showing a structure of a semiconductor device 200 according to the first embodiment of the present invention. FIGS. 2 and 3 are plan views showing different examples of the surface (circuit surface side) of the semiconductor device 200 from which a solder ball B is removed. In FIGS. 1 to 3, the same reference numerals as in the prior art shown in FIG. 16 denote the same parts, and a description thereof will be properly omitted.

Similar to the conventional semiconductor device 20 shown in FIG. 16, the semiconductor device 200 shown in FIGS. 1, 2, and 3 comprises a plurality of connection pads 2 formed on the surface of a semiconductor substrate 1 bearing a circuit element or elements formed in an integrated manner within the circuit element forming region DA, a passivation film 3 which is made of silicon oxide, silicon nitride, or the like and formed on the surface of the semiconductor substrate 1 so as to expose the center of each connection pad 2, and a protective film 4 formed on the upper surface of the passivation film 3.

Similar to the conventional semiconductor device 20, the semiconductor device 200 according to the first embodiment comprises conductive layers 5 which are formed on the protective film 4 and electrically connected to the connection pads 2 (first connection pads), and posts 6 formed on the conductive layer 5. The semiconductor device 200 further comprises, of the connection pads 2, at least one ground pad 2A (second connection pad) connected to ground potential, and at least one feeding pad 2B (third connection pad) which is connected to a predetermined circuit and receives a predetermined power. The semiconductor device 200 further comprises a ground plane GP formed from at least one conductive layer 5-1 (first conductive layer) which is connected to the ground pad 2A and extends onto the protective film 4, and at least one upper conductive layer 8 (second conductive layer) which is formed on an encapsulating film 7 and so arranged as to face the conductive layer 5-1 through the part of the film 7. The semiconductor device 200 also has a post 6A (first columnar electrode) which is electrically connected to the ground pad 2A through the conductive layer 5-1 and is connected to the upper conductive layer 8, and a post 6B (second columnar electrode) which is electrically connected to the feeding pad 2B through the conductive layer 5-1 and is connected to the upper conductive layer 8.

As shown in FIG. 2, the conductive layer 5-1 electrically connected to the ground pad 2A and the upper conductive layer 8 electrically connected to the ground pad 2A and feeding pad 2B are disposed at positions where they face each other via the encapsulating film 7. The conductive layer 5-1 serves as the ground plane GP at the ground potential, and the facing upper conductive layer 8 serves as a feeding electrode, thus forming an inverted F-shaped antenna. The pads are electrically connected to circuit elements formed in circuit element forming regions DA on the semiconductor substrate.

In the first embodiment, the inverted F-shaped antenna is formed as an antenna element. However, the present invention is not limited to this, and various antenna elements such as an inverted L-shaped antenna, patch antenna, and microstrip antenna may be formed.

One antenna element is formed on the semiconductor substrate 1 in FIGS. 1 and 2, but the present invention is not limited to this. For example, a plurality of antenna elements may be arrayed on one chip to constitute a phased array antenna, and a desired directional characteristic may be obtained. Alternatively, a plurality of antenna elements may be formed, and their directions may be changed to reduce the antenna directivity. FIG. 3 shows an example of a device in which two antenna elements are formed from a first antenna element made up of a conductive layer 5-1 serving as a ground plane GP and a facing upper conductive layer 8-1, and a second antenna element made up of a conductive layer 5-2 serving as the ground plane GP and a facing upper conductive layer 8-2, and the directions of these antenna elements are differed by 90°.

FIGS. 4 to 9 are sectional views for explaining the manufacturing steps of the semiconductor device 200 according to the first embodiment of the present invention. The manufacturing steps will be explained with reference to FIGS. 4 to 9.

Figure 4:
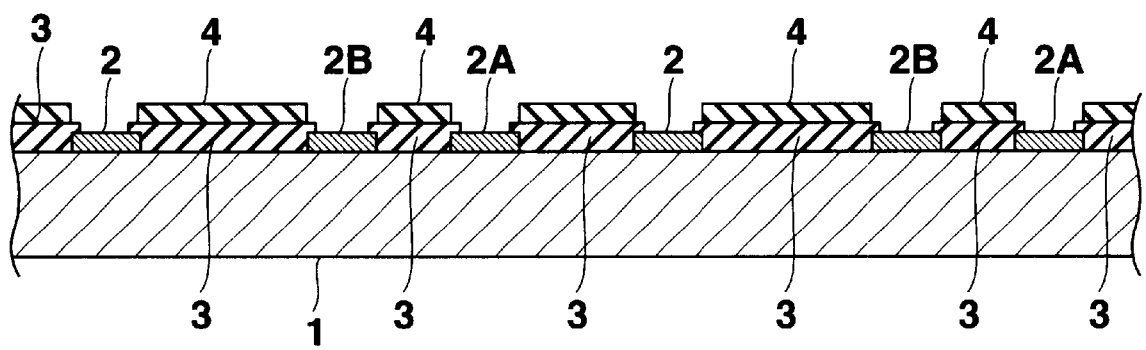
FIGS. 4 to 9 are sectional views for explaining manufacturing steps according to the first embodiment of the present invention.

In the manufacturing steps according to the first embodiment, as shown in FIG. 4, a passivation film 3 made of silicon oxide, silicon nitride, or the like is formed on the upper surfaces of a plurality of connection pads 2 which are made from aluminum electrodes or the like, and formed on the surface of a wafer (semiconductor substrate) 1. The substrate bears a circuit element formed in the circuit element forming region and has a plurality of chip formation regions. The passivation film 3 is so formed as to expose the center of each connection pad 2. The plurality of pads include at least one ground pad 2A and at least one feeding pad 2B. Then, a protective film 4 with openings each so as to expose the center of the connection pad 2 is formed on the upper surface of the passivation film 3. The protective film 4 is formed by, e.g., applying a polyimide-based resin to the entire upper surface of the passivation film 3 and the pads 2 on the wafer 1, curing the resin, performing resist patterning and protective film patterning with an etching solution, and removing the resist.

Formation of the protective film 4 can adopt a method of applying a polyimide-based resin by spin coating, a printing method using a squeegee, or an ink-discharge coating method. The protective film material is not limited to the polyimide-based resin, and may be an epoxy-based resin, PBO (benzoxydol-based resin) or the like.

Figure 5:
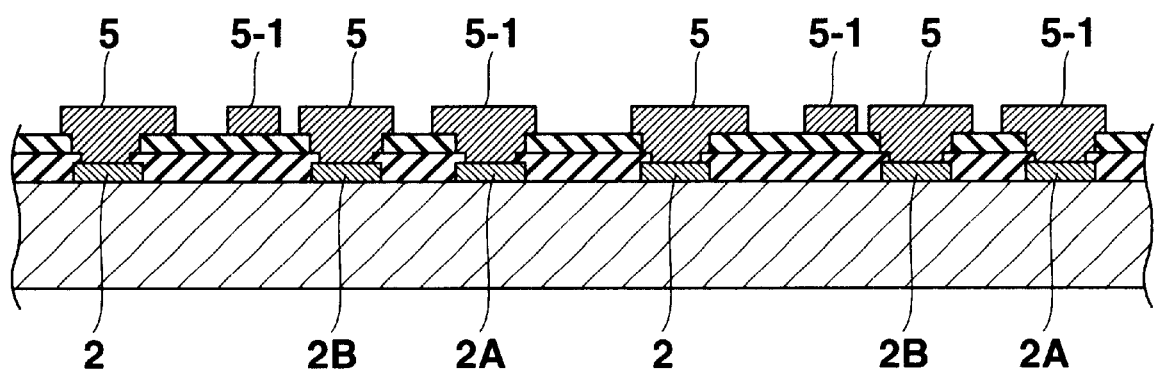

As shown in FIG. 5, conductive layers 5 are formed on portions of the connection pads 2 and feeding pads 2B exposed through the openings formed in the protective film 4 and passivation film 3. Conductive layers 5-1 corresponding to ground planes GP are formed on the ground pads 2A.

The conductive layers 5 and 5-1 are formed as follows. A UBM (Under Bump Metal) layer (not shown) made of copper (Cu), titanium (Ti), or the like is deposited on the entire surface of the protective film 4 by sputtering or the like. A photoresist is applied onto the UBM layer, cured, and then patterned by photolithography in correspondence with openings with a predetermined shape. The openings formed by the resist undergo electroplating by using the UBM layer as a current path.

The conductive layers 5 and 5-1 may be formed by electroless plating. Examples of the material used for these conductive layers are copper, aluminum, and gold which exhibit good conductive characteristics, and an alloy of them.

Figure 6:
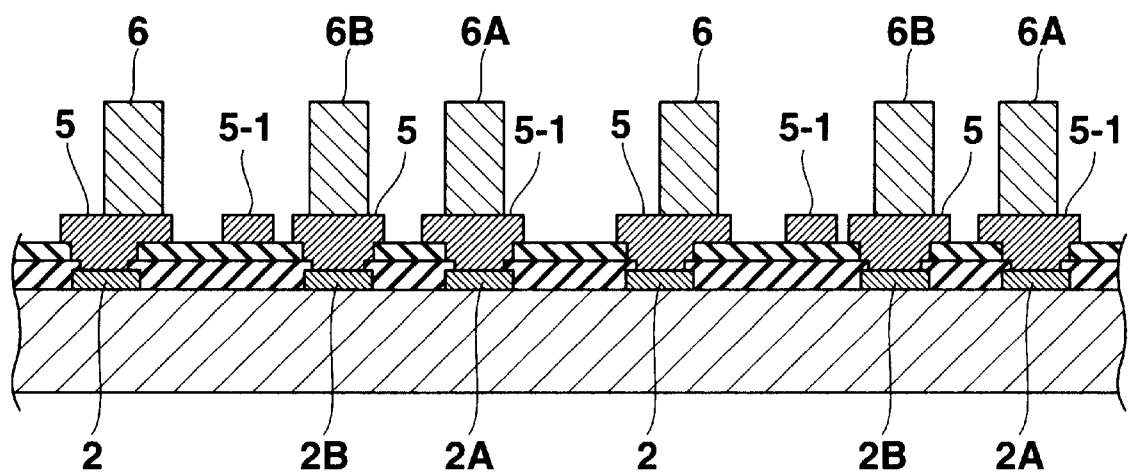

As shown in FIG. 6, posts 6, 6A, and 6B are formed from columnar electrodes at predetermined portions on the conductive layers 5 and 5-1.

The posts are formed by, e.g., applying a post formation photoresist to a thickness of about 100 to 150 μm, curing the photoresist, forming openings which expose predetermined portions of the conductive layers 5 and 5-1, and performing electroplating for the interiors of the openings by using the UBM layer as a current path. Each post may be formed by electroless plating or a stud bump method.

Examples of the post material are copper, solder, gold, and nickel which exhibit good conductive characteristics. When solder is used as a post formation material, a spherical electrode can also be formed by succeeding reflow processing. When the post 6 is formed using solder, a printing method can also be employed in addition to the above methods. After the post 6 is formed, an unnecessary portion of the UBM layer is etched away.

Figure 7:
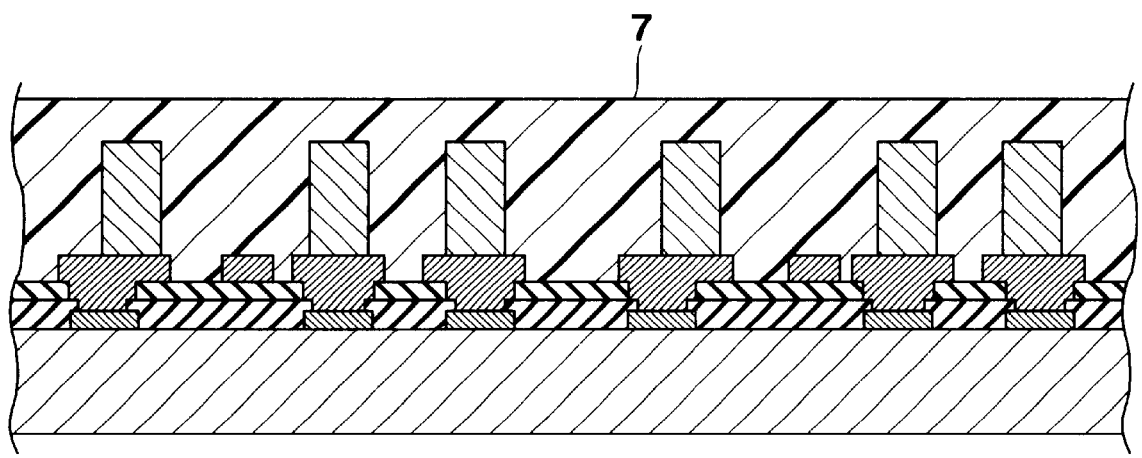

As shown in FIG. 7, an encapsulating film 7 is formed by, e.g., molding the entire surface side of the wafer 1 with a resin such as polyimide or epoxy so as to cover the posts, protective films, and conductive layers. The encapsulating film 7 is preferably made of a resin containing substantially the same main component as that of the above-described protective film 4 in order to ensure reliability which copes with environmental changes. The method of forming the encapsulating film 7 may be a printing method, a dipping method, spin coating, or die coating in addition to the above-mentioned molding method.

Figure 8:
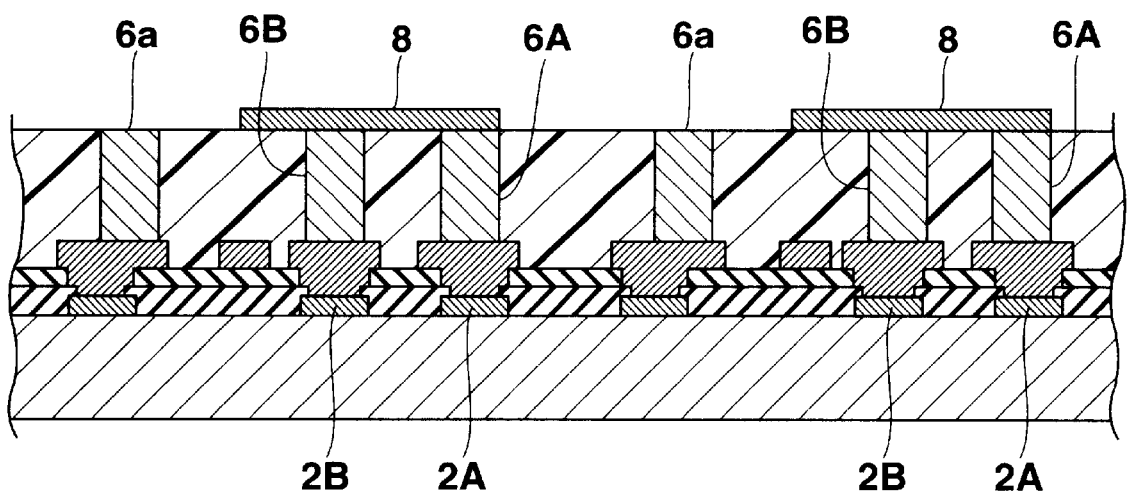

After the encapsulating film 7 is formed, the upper surface of the encapsulating film 7 is cut and polished to expose end faces 6a of the posts 6, 6A, and 6B, and oxide films on the upper surfaces of the parts are removed, as shown in FIG. 8.

A metal foil such as a copper foil is laminated by solder printing or the like on the film 7, and selectively etched, thereby forming upper conductive layers 8 which are electrically connected to the post 6A corresponding to the ground pad 2A and the post 6B corresponding to the feeding pad 2B. Alternatively, conductive plates serving as the upper conductive layers 8 may be fixed with a conductive adhesive to the posts 6A and 6B corresponding to the ground pad 2A and feeding pad 2B.

Figure 9:
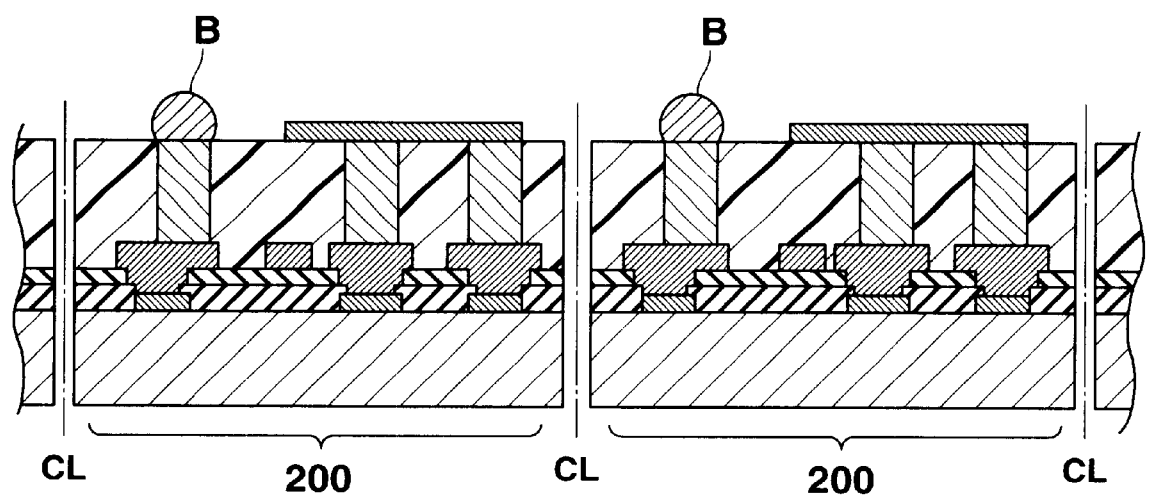

If necessary, solder balls B are arranged on posts 6 not covered with the upper conductive layer 8, thus forming terminal portions, as shown in FIG. 9.

The wafer 1 is diced along predetermined cut lines CL into chip formation regions. As a result, the semiconductor device 200 having the structure shown in FIG. 1 is formed.

That is, the semiconductor device 200 having the structure shown in FIG. 1, i.e., an inverted F-shaped antenna constituted by the ground plane GP formed from the conductive layer 5-1, and the upper conductive layer 8 formed on the posts 6A and 6B corresponding to the ground pad 2A and feeding pad 2B so as to be electrically connected to the posts 6A and 6B is manufactured.

Figure 10:
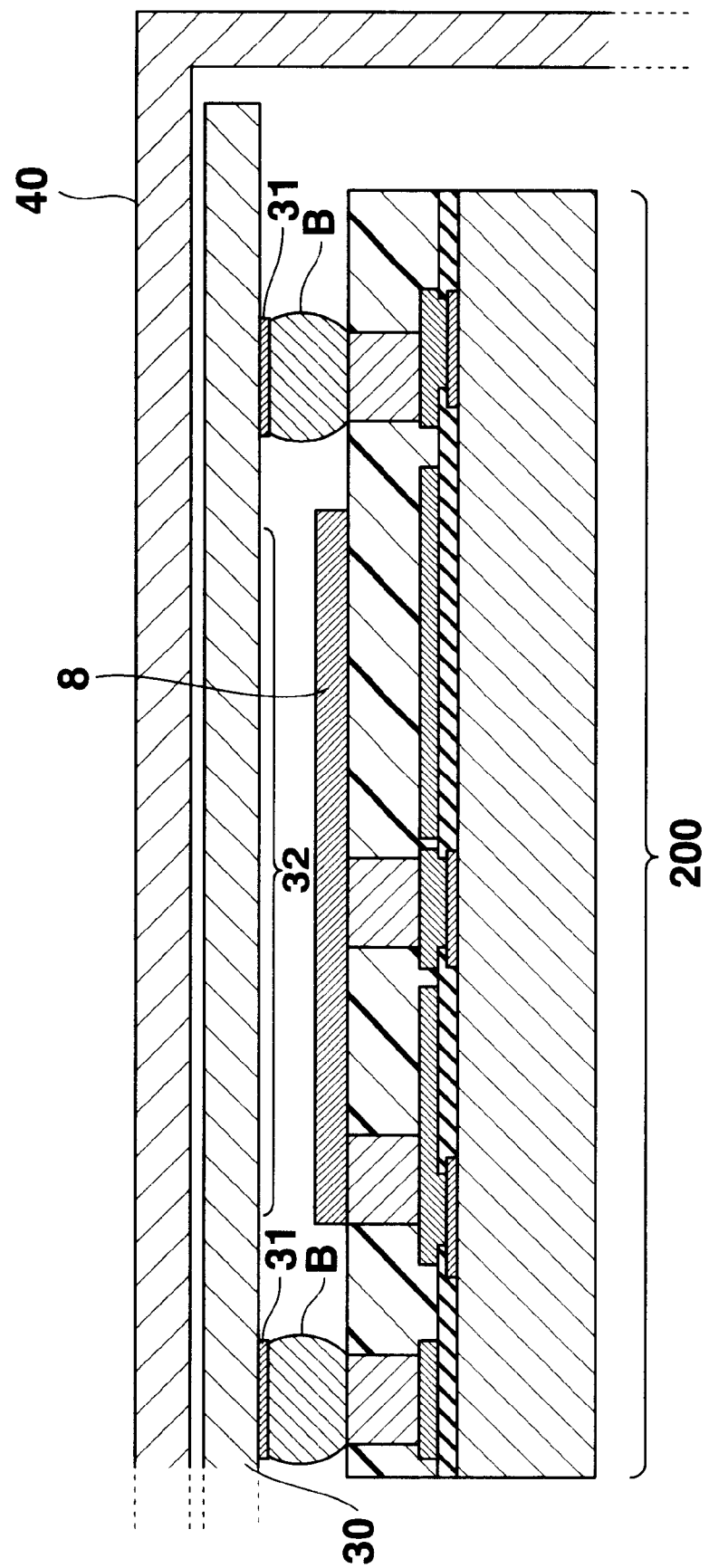
FIG. 10 is a sectional view showing a first example of the mounting structure of the semiconductor device onto a wiring board according to the first embodiment of the present invention.
Figure 11:
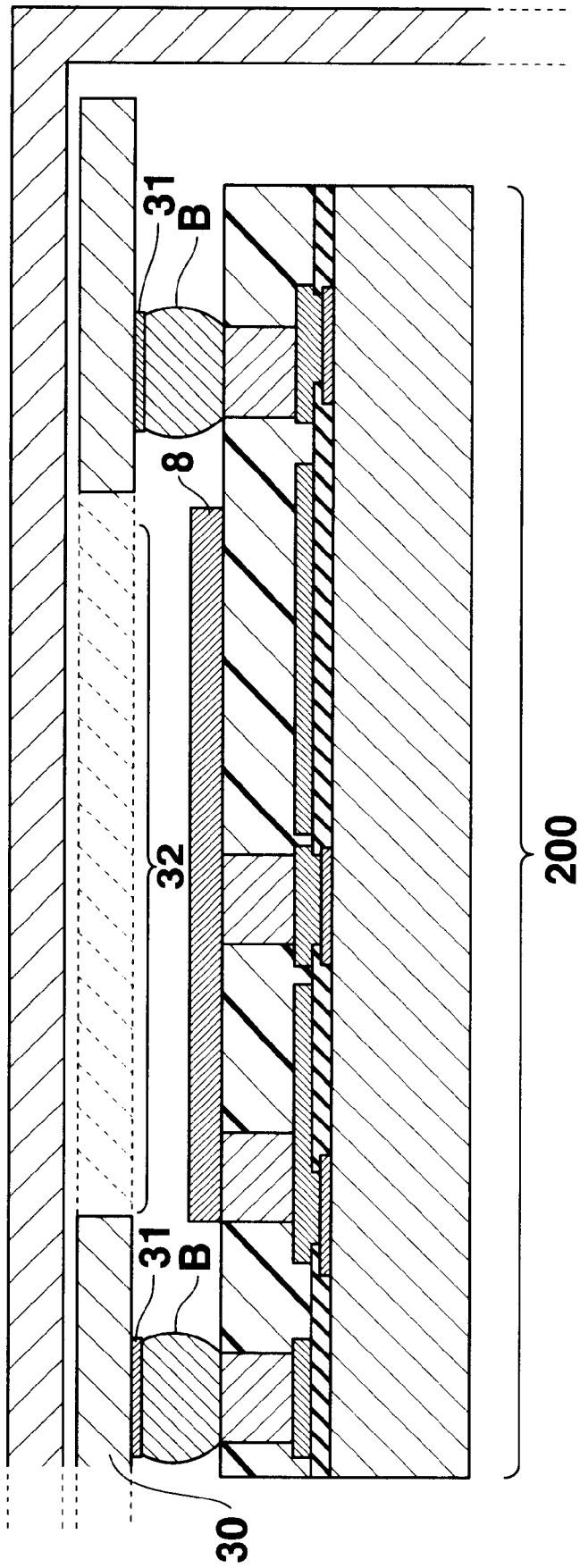
FIG. 11 is a sectional view showing a second example of the mounting structure of the semiconductor device onto the wiring board according to the first embodiment of the present invention.

FIGS. 10 and 11 show mounting structures suitable when the semiconductor device 200 with this structure is mounted on a wiring board bearing a predetermined wiring pattern.

In the structure shown in FIG. 10, a wiring board 30 bearing a plurality of wiring patterns is set in an electronic device housing 40. The semiconductor device 200 is mounted on the wiring board 30 by being connected to a predetermined wiring pattern 31 formed on the wiring board 30 via the solder balls B formed on the posts 6. The upper conductive layer 8 functioning as the antenna of the semiconductor device 200 faces the wiring board 30.

If a wiring pattern exists in a region 32 facing the upper conductive layer 8 of the wiring board 30, the radiation efficiency of radio waves radiated by the upper conductive layer 8 decreases or the radiation pattern is disturbed, degrading the antenna performance. To prevent this, no wiring pattern is formed in the region 32 facing the upper conductive layer 8 of the wiring board 30. Accordingly, the degradation in antenna performance can be suppressed.

In the structure shown in FIG. 11, the region 32 facing the upper conductive layer 8 of the wiring board 30 is an opening. In this case, almost no member disturbs radio waves radiated by the upper conductive layer 8. A decrease in the radiation efficiency of radio waves and degradation in antenna performance can be minimized, and good performance can be attained.

As described above, the first embodiment constitutes an inverted F-shaped antenna by forming the conductive layer 5-1 as the ground plane GP, and forming the upper conductive layer 8 on the posts 6A and 6B electrically connected to the ground pad 2A and feeding pad 2B. The antenna can be mounted inside a chip, and a module with an antenna which is constituted using this chip can be micronized.

Since the antenna is mounted inside the chip, the wiring length from a circuit on the chip to the antenna can be greatly shortened in comparison with a structure in which the antenna is disposed outside the chip. Feed line loss to an electrode which constitutes the antenna can be minimized. This contributes to improvement in transmission channel characteristics and provides a high-performance antenna.

Figure 12:
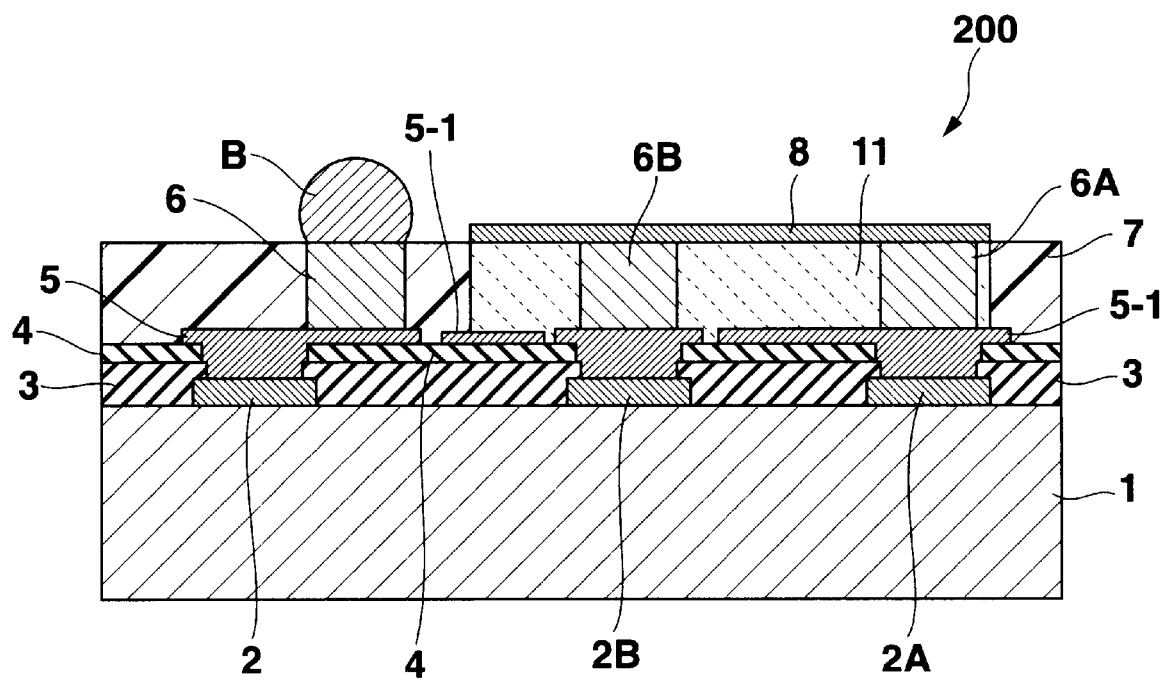
FIG. 12 is a sectional view showing another structure of the semiconductor device according to the first embodiment of the present invention.

In the above-described embodiment, the encapsulating film 7 is interposed between the ground plane GP and the upper conductive layer 8. Instead, as shown in FIG. 12, a high-dielectric member 11 may be interposed between the ground plane GP and the upper conductive layer 8. In this case, after the posts 6, 6A, and 6B are formed, the dielectric member 11 is fixed to the ground plane GP (conductive layer 5-1) with an adhesive or the like. Then, the upper conductive layer 8 is laid out through the above-mentioned encapsulation step.

By interposing the high-dielectric member made of barium titanium or the like between the ground plane GP and the upper conductive layer 8, the electrical length of the antenna element can be adjusted. In other words, the resonance frequency of the antenna element can be changed without changing the pattern size of the upper conductive layer 8. When the resonance frequency of the antenna element is kept constant, the areas of the ground plane GP and upper conductive layer 8 can be decreased by assembling the high-dielectric member.

<Second Embodiment>

Figure 13A:
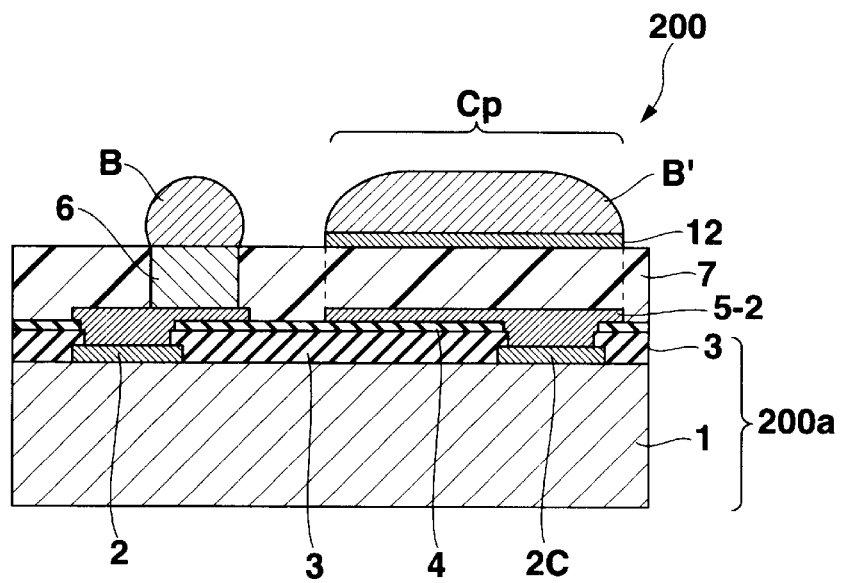
FIG. 13A is a sectional view showing a structure of a semiconductor device according to a second embodiment of the present invention.

FIG. 13A is a sectional view showing a semiconductor device 200 according to the second embodiment of the present invention. In FIG. 13A, the same reference numerals as in the first embodiment denote the same parts, and a description thereof will be properly omitted.

The semiconductor device 200 according to the second embodiment comprises a conductive layer 5-2 (first conductive layer) connected to a predetermined connection pad 2C (second connection pad), and an upper conductive layer 12 (second conductive layer) formed on an encapsulating film 7. As shown in FIG. 13A, the conductive layer 5-2 and upper conductive layer 12 are formed at positions where they face each other via a part of the encapsulating film 7. A solder layer B' is formed by metallization processing such as solder printing, on the upper conductive layer 12.

Figure 13B:
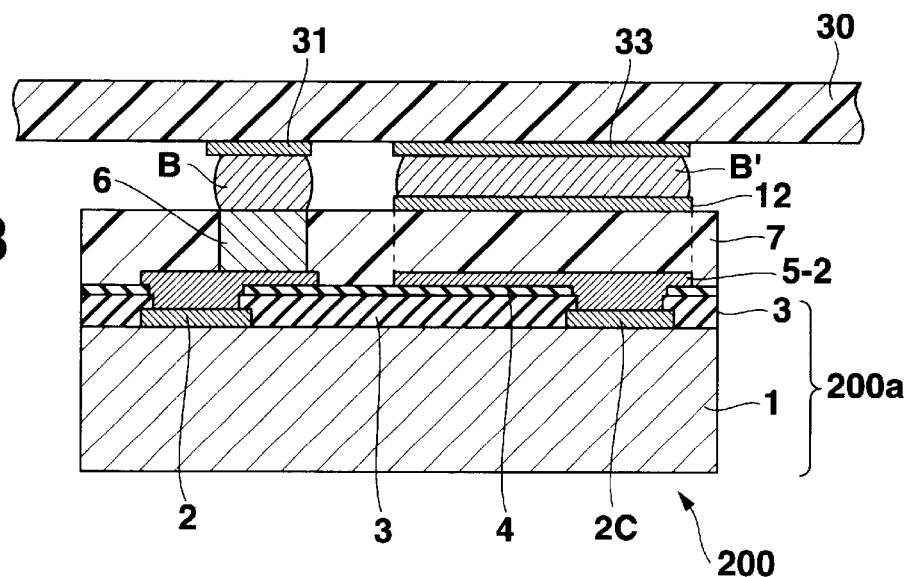
FIG. 13B is a sectional view showing a mounting form of the semiconductor device onto a wiring board according to the second embodiment of the present invention.

FIG. 13B is a sectional view showing a state in which the semiconductor device 200 shown in FIG. 13A is mounted on a wiring board 30. In this case, the upper conductive layer 12 is connected to a pad 33 formed on a wiring board 30 via the solder layer B'. The upper conductive layer 12, encapsulating film 7, and conductive layer 5-2 form a capacitive element Cp.

A post 6 electrically connected to a connection pad 2 via a conductive layer 5 is connected to a wiring pattern 31 of the wiring board 30 via a solder ball B.

Figure 13C:
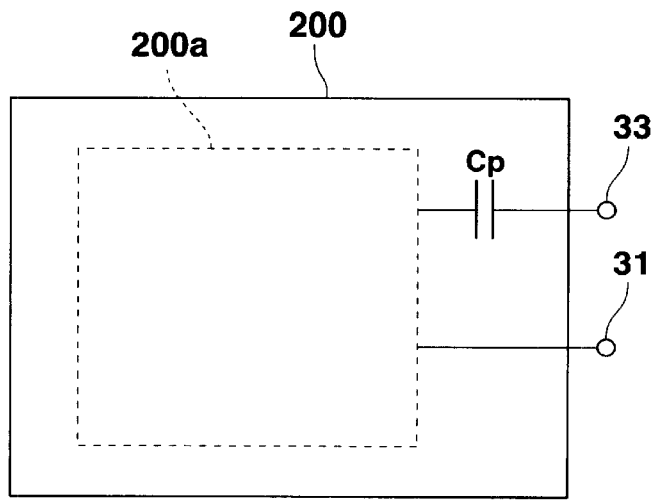
FIG. 13C is a plan view showing a connection example of a passive element formed by the second embodiment of the present invention in the mounting form shown in FIG. 13B.

The capacitive element Cp can be formed between the pad 33 on the wiring board 30 and the conductive layer 5-2 inside the chip, and an equivalent circuit as shown in FIG. 13C can be constituted. In FIG. 13C, reference numeral 200a denotes a circuit part formed on a semiconductor substrate 1 of the semiconductor device 200 in advance, as shown in FIG. 13A. The capacitive element Cp can be connected to the circuit part 200a.

According to the second embodiment, the capacitive element and chip can be integrated. When a module having a capacitive element is constituted using this chip, the module can be micronized in comparison with a conventional structure in which the capacitive element is arranged outside the chip.

Figure 14:
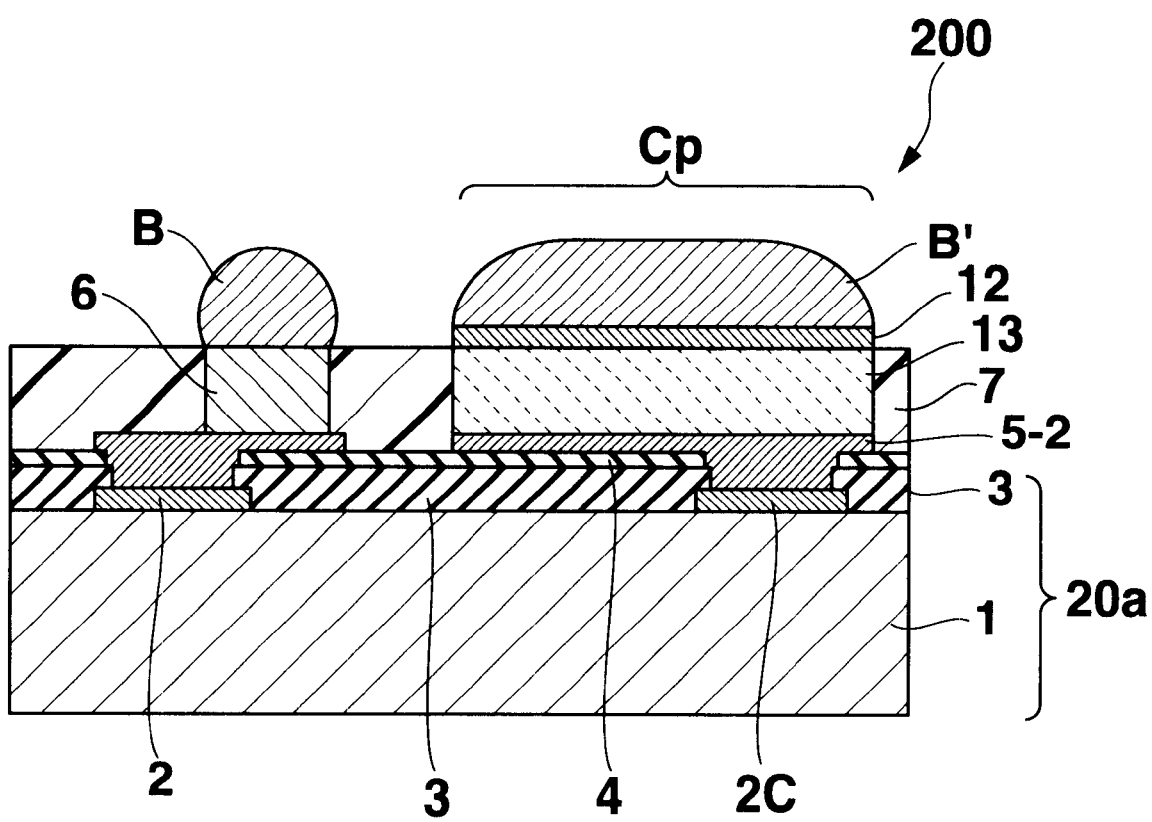
FIG. 14 is a sectional view showing another structure of the semiconductor device according to the second embodiment of the present invention.

In the above-described embodiment, the encapsulating film 7 is interposed between the part of the upper conductive layer 12 and the conductive layer 5-2 to form a capacitive element. Instead, as shown in FIG. 14, a dielectric layer 13 may be interposed between the upper conductive layer 12 and the conductive layer 5-2 to form a capacitive element Cp. In this structure, the capacitance of the capacitive element is determined by the relative dielectric constant, thickness, and area of the dielectric layer 13 interposed between the upper conductive layer 12 and the conductive layer 5-2. The use of a high-relative-dielectric-constant dielectric can increase the capacitance value without changing the areas of the upper conductive layer 12 and conductive layer 5-2. When the capacitance value is kept constant, the area of each conductive layer can be decreased. The high-relative-dielectric-constant dielectric material which forms the dielectric layer 13 is a high-dielectric material such as barium titanium or tantalum titanium.

Figure 15A:
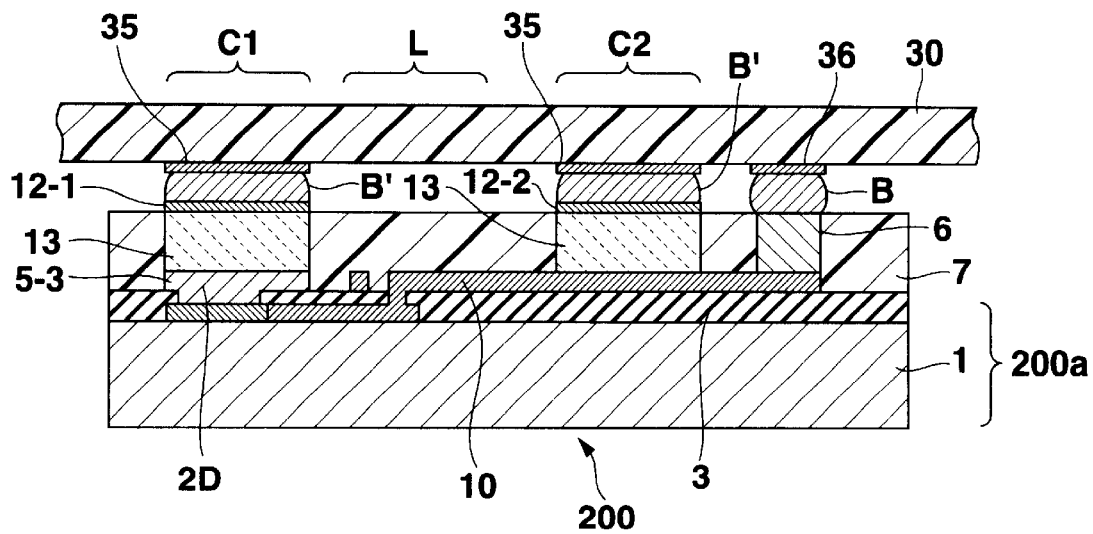
FIG. 15A is a sectional view showing a mounting form of a modification of the semiconductor device onto a wiring board according to the second embodiment of the present invention.
Figure 15B:
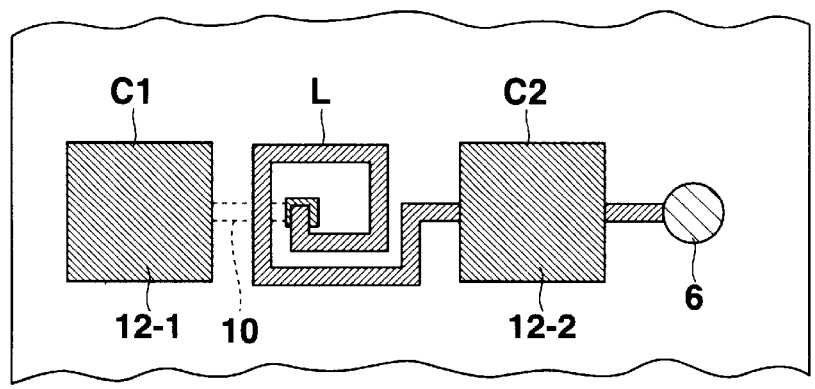
FIG. 15B is a plan view showing a surface side of the semiconductor device in FIG. 15A.
Figure 15C:
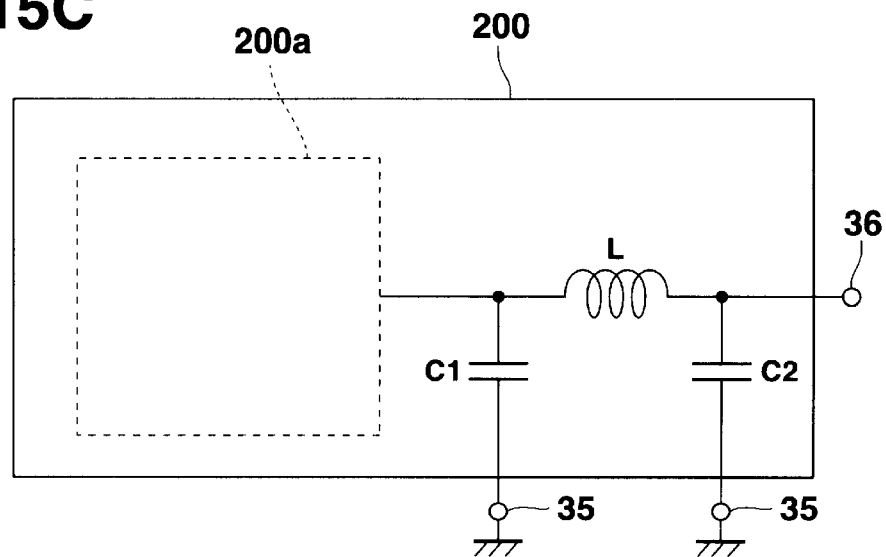
FIG. 15C is a plan view showing a structure of a passive circuit formed by the modification shown in FIG. 15A.

FIGS. 15A to 15C show a modification of the second embodiment. FIG. 15A is a sectional view showing the semiconductor device 200 of the modification and a state in which the semiconductor device 200 is mounted on the wiring board 30. FIG. 15B is a plan view showing the surface of the semiconductor device 200 from which the encapsulating film 7 is omitted.

As shown in FIG. 15A, the modification comprises a connection pad 2D (second connection pad) electrically connected to conductive layers 5-3 and 10 (first conductive layer). Further, the modification comprises upper conductive layers 12-1 and 12-2 (second conductive layer) formed at positions where they face the conductive layers 5-3 and 10 thought dielectric layers 13.

A columnar electrode 6 is formed on the conductive layer 10, and a solder ball B is formed on the columnar electrode 6. The columnar electrode 6 is electrically connected via the solder ball B to a pad 36 formed on the wiring board 30. Solder layers B' are formed on the upper conductive layers 12-1 and 12-2 by metallization processing such as solder printing. The upper conductive layers 12-1 and 12-2 are connected via the solder layers B' to pads 35 formed on the wiring board 30.

With this arrangement, two capacitive elements C1 and C2 identical in structure as the capacitive element Cp are respectively formed between the upper conductive layer 12-1 and the conductive layer 5-3 and between the upper conductive layer 12-2 and the conductive layer 10.

As shown in FIG. 15B, the conductive layer 10 is patterned into a square coil shape to form an inductive element L.

Various passive circuits can be constituted by combining the capacitive elements C1 and C2 and the inductive element L. For example, a π low-pass filter shown in FIG. 15C can be formed and connected to the circuit part 200a formed on the semiconductor substrate 1. A filter circuit formed from a passive element can be mounted inside the chip, and a module with a filter circuit which is constituted using this chip can be micronized.

In this modification, the filter circuit is implemented by a combination of two capacitive elements and one inductive element. The present invention is not limited to this, and various passive circuits may be constituted by combining pluralities of capacitive elements, inductive elements, and conductive layers.

Furthermore, the present invention is not limited to the capacitive element and inductive element, and conductive layers formed on the semiconductor substrate 1 may form various thin-film circuit elements such as a resistor, thin-film transformer, thin-film SAW (Surface Acoustic Wave) filter, microstrip line, and MMIC (Microwave Monolithic Integrated Circuit). Alternatively, these components may be combined to constitute various passive circuits.

In this case, various passive circuits can be mounted inside the chip, and the module constituted using this chip can be micronized. Compared to a conventional structure in which these passive circuits are arranged outside the chip, the wiring length from a circuit on the chip to each passive circuit can be greatly shortened. Antenna loss can be suppressed to improve frequency characteristics particularly in an RF circuit.

What is claimed is:

1. A semiconductor device comprising:
   a semiconductor substrate having an upper surface on which a circuit element and a plurality of connection pads which are connected to an external device and which include at least one first connection pad and at least one second connection pad are formed;
   a first insulating film formed on the upper surface of the semiconductor substrate to expose a central portion of each of the connection pads, the first insulating film having the same area as that of the upper surface of the semiconductor substrate;
   a first columnar electrode which is formed on the first connection pad so as to be electrically connected to the first connection pad and connected to an external device, the first columnar electrode having an upper end surface externally exposed;
   at least one first conductive layer which is formed on the first insulating layer so as to be electrically connected to the second connection pad;
   a second insulating film which is formed at least around the first columnar electrode, on the first insulating film and on the first conductive layer, the second insulating film having the same area as that of the surface of the semiconductor substrate;
   a second conductive layer which is formed on the second insulating film so as to face the first conductive layer; and
   at least one passive element which is formed to include the first and second conductive layers.

2. A device according to claim 1, wherein the plurality of connection pads include at least one third connection pad, and
   which further comprises a second columnar electrode which is electrically connected to the second connection pad and is connected to the second conductive layer, and
   a third columnar electrode which is electrically connected to the third connection pad and is connected to the second conductive layer.

3. A device according to claim 2, wherein the second connection pad constitutes a ground pad, the third connection pad constitutes a feeding pad, and the passive element includes an antenna element.

4. A device according to claim 3, wherein the antenna element includes an inverted F-shaped antenna.

5. A device according to claim 1, wherein:
   the passive element includes a capacitive element, and
   which further comprises, on the second conductive layer, a connection section to be connected to a wiring board having a plurality of wiring patterns electrically connected to the semiconductor device through the first columnar electrode.

6. A device according to claim 1, further comprising:
   a plurality of passive elements; and
   a third conductive layer connecting the passive elements.

7. A device according to claim 6, wherein:
   the third conductive layer constitutes at least one thin-film passive element, and
   the plurality of passive elements and the thin-film passive element form a passive circuit.

8. A device according to claim 7, wherein:
   the plurality of passive elements include at least two capacitive elements,
   the thin-film passive element includes an inductive element which is formed by patterning the third conductive layer so as to induce an inductance component, and
   the passive circuit includes a filter circuit.

9. A device according to claim 1, wherein the encapsulating film has a dielectric portion positioned between the first and second conductive layers.

10. An electronic device comprising:
    a semiconductor device having a semiconductor substrate including an upper surface on which a circuit element and a plurality of connection pads which are connected to an external device, and include at least one first connection pad, and at least one second connection pad are formed;
    a first insulating film formed on the upper surface of the semiconductor substrate to expose a central portion of each of the connection pads, the first insulating film having the same area as that of said upper surface of the semiconductor substrate;
    a columnar electrode which is electrically connected to the first connection pad and connected to an external device, the columnar electrode having an upper end surface externally exposed;
    a first conductive layer which is formed on the first insulating layer;
    a second insulating film which is formed at least around the first columnar electrode, on the first conductive layer, the second insulating film having the same area as that of said surface of said semiconductor substrate,
    a second conductive layer which is formed on the second insulating film so as to face the first conductive layer, and
    an antenna element which is formed from the first and second conductive layers; and
    a wiring board on which a plurality of wiring patterns are formed, the wiring patterns being electronically connected to the semiconductor device through the columnar electrode,
    the semiconductor device having a structure in which the semiconductor device is electrically connected to the wring patterns on the wiring board via the columnar electrode,
    wherein no wiring pattern is formed in a region of the wiring board that faces the second conductive layer of the semiconductor device.

11. A device according to claim 10, wherein the region of the wiring board that faces the second conductive layer of the semiconductor device includes an opening.

* * * * *